(12) United States Patent
Shoki

(10) Patent No.: US 7,294,438 B2
(45) Date of Patent: Nov. 13, 2007

(54) METHOD OF PRODUCING A REFLECTIVE MASK AND METHOD OF PRODUCING A SEMICONDUCTOR DEVICE

(75) Inventor: Tsutomu Shoki, Tokyo (JP)

(73) Assignee: Hoya Corporation, Tokyo (JP)

( * ) Notice: Subject to any disclaimer, the term of this patent is extended or adjusted under 35 U.S.C. 154(b) by 423 days.

(21) Appl. No.: 10/802,886

(22) Filed: Mar. 18, 2004

(65) Prior Publication Data

US 2004/0196579 A1 Oct. 7, 2004

(30) Foreign Application Priority Data

Mar. 19, 2003 (JP) ............................. 2003-074897

(51) Int. Cl.
*G03F 1/00* (2006.01)
(52) U.S. Cl. ........................................................ 430/5
(58) Field of Classification Search .................... 403/5; 430/311–313, 394; 378/35
See application file for complete search history.

(56) References Cited

U.S. PATENT DOCUMENTS 6,586,145 B2 * 7/2003 Yokoi et al. ................... 430/5

| 2001/0051304 | A1 | 12/2001 | Stivers et al. |
| 2002/0014403 | A1 * | 2/2002 | Hoshino ................. 204/192.32 |
| 2002/0045108 | A1 | 4/2002 | Lee et al. |

FOREIGN PATENT DOCUMENTS

| EP | 1498936 A1 | 1/2005 |
| JP | 8-213303 A | 8/1996 |
| JP | 2002-122981 A | 4/2002 |
| JP | 2002-319542 A | 10/2002 |

* cited by examiner

*Primary Examiner*—S. Rosasco
(74) *Attorney, Agent, or Firm*—Sughrue Mion, PLLC

(57) ABSTRACT

This invention is a method of producing a reflective mask comprising a substrate, a reflective multilayer film formed on the substrate to reflect exposure light, and at least one layer formed on the reflective multilayer film to define a nonreflecting region for the exposure light. The method comprises the steps of: (a) patterning a layer formed on and adjacent to a topmost layer of the reflective multilayer film; and (b) removing a reaction product produced following patterning in the step (a) and deposited on an exposed surface of the reflective multilayer film which is exposed as a result of patterning in the step (a). The step (a) may be performed by the use of an oxygen-containing plasma process.

20 Claims, 3 Drawing Sheets

METHOD OF PRODUCING A REFLECTIVE MASK AND METHOD OF PRODUCING A SEMICONDUCTOR DEVICE

This invention claims priority to prior Japanese applications JP 2003-74897, the disclosure of which is incorporated herein by reference.

BACKGROUND OF THE INVENTION

This invention relates to a method of producing a reflective mask for use in optical exposure in a semiconductor process and a method of producing a semiconductor device.

Recently, in the semiconductor industry, an EUV (Extreme Ultra Violet) lithography, which is an exposure technique using EUV light, appears promising following the reduction in size of a semiconductor device. It is noted here that the EUV light means light of a wavelength band within a soft X-ray region or a vacuum ultraviolet region, specifically, light having a wavelength of about 0.2-100 nm.

As a mask used in the EUV lithography, a reflective mask for exposure is proposed, for example, in Japanese Patent Application Publication (JP-A) No. H08-213303 (Reference 1). The reflective mask comprises a substrate, a reflective multilayer film formed on the substrate to reflect exposure light, and a buffer layer formed on the reflective multilayer film. On the buffer layer, an absorber film for absorbing the exposure light is formed as a patterned film. In an exposure apparatus using the reflective mask, light incident to the reflective mask is partially absorbed at a part where the absorber film is present and is partially reflected by the reflective multilayer film at another part where the absorber film is not present. The former part and the latter part may be referred to as an absorbing region and a reflecting region, respectively. An image formed by the light that is reflected by the reflective multilayer film is transferred onto a semiconductor substrate through a reflection optical system. Herein, the buffer layer serves to protect the reflective multilayer film when the absorber film is patterned by dry etching or the like in a mask production process. In order to increase the reflectivity for the exposure light, the buffer layer formed on the reflecting region (i.e., the part where the absorber film is not formed) of the mask is generally removed after the absorber film is patterned. As a result, the reflective multilayer film is exposed in the reflecting region.

As the above-mentioned reflective multilayer film, a multilayer film obtained by alternately laminating Mo layers and Si layers each having a thickness of several nanometers is known as a film adapted to reflect the EUV light having a wavelength of 13-14 nm.

The buffer layer is preferably made of a material which has high etch selectivity to the absorber film and which assures a smooth surface. As the material of the type, Japanese Patent Application Publication (JP-A) No. 2002-319542 (Reference 2) proposes a material containing Cr as a main component.

In Japanese Patent Application Publication (JP-A) No. 2002-122981 (Reference 3), it is proposed that a protection film formed on the reflecting region (i.e., the part where the pattern of the absorber film is not formed) of the mask is not removed after patterning of the absorber film but is used to increase the reflectivity for the exposure light.

In production of the reflective mask described in References 1 and 2, the buffer layer formed on the reflecting region of the mask is removed after the absorber film is patterned. In this case, the Si layer is generally formed as a topmost layer of the reflective multilayer film for the purpose of protection. This is because, in the above-mentioned reflective multilayer film comprising the Mo and the Si layers alternately laminated, Mo is more easily oxidized. Therefore, the buffer layer is formed on the Si layer as the topmost layer. For example, if the buffer layer is made of a material containing Cr as a main component and etched by the use of a gas containing chlorine and oxygen, the etch selectivity to the Si layer is as large as 20 or more. In this event, the buffer layer is patterned without no substantial reduction in thickness of the Si layer.

However, according to the inventor's study, it has been found out that, in the above-mentioned technique, a thin deposit of oxide is produced on the surface of the Si layer as the topmost layer of the reflective multilayer film. This is presumably because reaction is caused between oxygen and the Si layer at the top of the reflective multilayer film or an Si-based material within a processing chamber since oxygen-containing plasma is used upon removal of the buffer layer. Further, it has been found out that the deposit of oxide decreases the reflectivity of the reflective multilayer film. The thickness of the deposit of oxide is different depending upon the etching condition or the like but is generally equal to about 2 nm, as confirmed by low-angle X-ray diffraction or the like. It has been found out that the reflectivity is decreased by about 3%.

On the other hand, in Reference 3, the protection film formed on the reflective region of the mask is not removed after the absorber film is patterned. In this case also, it has been found out that, depending upon the etching environment upon patterning, a thin deposit of oxide, silicide, or silicon oxide is produced on the surface of the protection film. It has been found out that the thin deposit of oxide, silicide, or silicon oxide decreases the reflectivity of the reflective multilayer film by about 5%.

Heretofore, such deposition of oxide, silicide, or silicon oxide and resultant decrease in reflectivity of the reflective multilayer film are not known and, as a matter of course, no countermeasure has been taken.

SUMMARY OF THE INVENTION

It is therefore an object of this invention to provide a method of producing a reflective mask, which is capable of preventing decrease in reflectivity as a result of deposition of oxide or the like produced on the surface of a reflective multilayer film during a mask production process.

In order to achieve the above-mentioned object, the present inventor earnestly studied and, as a result, completed the invention having the following structures.

First Aspect

A method of producing a reflective mask comprising a substrate, a reflective multilayer film formed on the substrate to reflect exposure light, and at least one layer formed as a patterned layer on the reflective multilayer film to define a nonreflecting region for the exposure light, the method comprising the steps of (a) patterning a layer formed on and adjacent to a topmost layer of the reflective multilayer film and (b) removing a reaction product produced following patterning in the step (a) and deposited on an exposed surface of the reflective multilayer film which is exposed as a result of patterning in the step (a).

Second Aspect

A method of producing a reflective mask comprising a substrate, a reflective multilayer film formed on the substrate to reflect exposure light, and at least one layer formed as a patterned layer on the reflective multilayer film to define a nonreflecting region for the exposure light, the method comprising the steps of (a) patterning a layer formed on and adjacent to a topmost layer of the reflective multilayer film by the use of an oxygen-containing plasma process and (b) removing oxide produced following patterning in the step (a), containing a component of the topmost layer of the reflective multilayer film, and deposited on an exposed surface of the reflective multilayer film which is exposed as a result of patterning in the step (a).

Third Aspect

A method of producing a reflective mask comprising a substrate, a reflective multilayer film formed on the substrate to reflect exposure light, a protection film formed on the reflective multilayer film to protect the reflective multilayer film, and at least one layer formed as a patterned layer on the protection film to define a nonreflecting region for the exposure light, the method comprising the steps of (a) patterning a layer formed on and adjacent to the protection film and (b) removing a reaction product produced following patterning in the step (a) and deposited on an exposed surface of the protection film.

Fourth Aspect

A method of producing a reflective mask according to one of the first and second aspects, wherein the patterned layer defining the nonreflecting region for the exposure light comprises a laminated film including an absorber layer for absorbing the exposure light and a buffer layer made of a material resistant against an environment upon patterning of the absorber layer, the laminated film being formed on and adjacent to the topmost layer of the reflective multilayer film, the layer patterned in the step (a) being the buffer layer.

Fifth Aspect

A method of producing a reflective mask according to any one of the first through the third aspects, wherein the step (b) is carried out by bringing the exposed surface of the reflective multilayer film or the protection film with the reaction product or the oxide formed thereon following patterning in the step (a) into contact with a solution containing hydrofluoric acid and/or fluorosilicic acid.

Sixth Aspect

A method of producing a reflective mask according to any one of the first through the third aspects, wherein the step (b) is carried out by bringing the exposed surface of the reflective multilayer film or the protection film with the reaction product or the oxide formed thereon following patterning in the step (a) into contact with an alkali aqueous solution.

Seventh Aspect

A method of producing a reflective mask according to any one of the first through the third aspects, wherein the step (b) is carried out by bringing the exposed surface of the reflective multilayer film or the protection film with the reaction product or the oxide formed thereon following patterning in the step (a) into contact with fluorine-containing plasma.

Eighth Aspect

A method of producing a reflective mask according to any one of the first through the seventh aspects, wherein the layer formed on and adjacent to the topmost layer of the reflective multilayer film is made of a material containing Cr or Ru as a main component.

Ninth Aspect

A method of producing a reflective mask according to any one of the first through the eighth aspects, wherein the reflective multilayer film comprises Mo layers and Si layers alternately laminated, the topmost layer of the reflective multilayer film being a layer made of elemental Si or a material containing Si as a main component.

Tenth Aspect

A method of producing a reflective mask according to any one of the first through the ninth aspects, wherein the patterned layer defining the nonreflecting region has a layer made of a material containing Ta as a main component.

Eleventh Aspect

A method of producing a reflective mask comprising a substrate, a reflective multilayer film formed on the substrate to reflect exposure light, and at least one layer formed as a patterned layer on the reflective multilayer film to define a nonreflecting region for the exposure light, the method comprising the steps of (a) causing deposition of oxide on the reflective multilayer film, the oxide containing a component of the topmost layer of the reflective multilayer film, and (b) removing the oxide from the reflective multilayer film.

Twelfth Aspect

A method of producing a semiconductor device, comprising the step of forming a fine pattern on a semiconductor substrate by lithography using the reflective mask produced by the method according to any one of the first through the eleventh aspects.

DESCRIPTION OF THE PREFERRED EMBODIMENTS

Figure 1A:
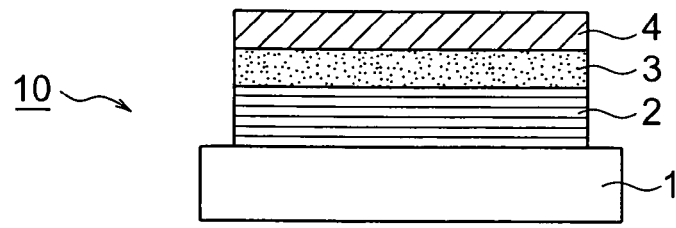
FIGS. 1A through 1D are sectional views for describing a series of steps of a method of producing a reflective mask according a first embodiment of this invention.

Now, description will be made about preferred embodiments of this invention with reference to the drawing. In the figures, similar parts are designated by like reference numerals.

Referring to FIG. 1A, a reflective mask blank 10 for use in production of a reflective mask according to a first embodiment of this invention has a structure in which a reflective multilayer film 2, a buffer layer 3, and an absorber layer 4 are successively formed on a substrate 1. FIGS. 1A through 1D show a series of steps for producing a reflective mask 20 according to this invention by patterning each of the absorber layer 4 and the buffer layer 3 of the reflective mask blank 10.

Figure 2A:
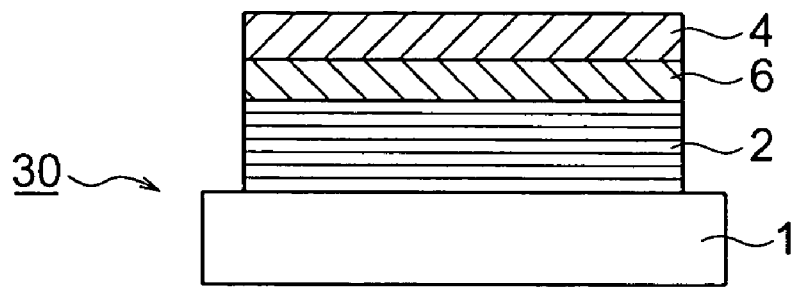
FIGS. 2A through 2C are sectional views for describing a series of steps of a method of producing a reflective mask according to a second embodiment of this invention.
Figure 2B:
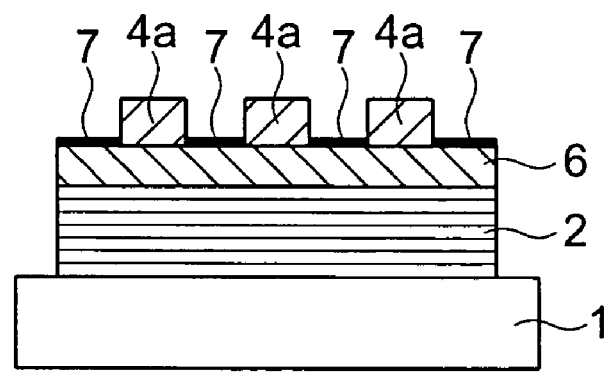
Figure 2C:
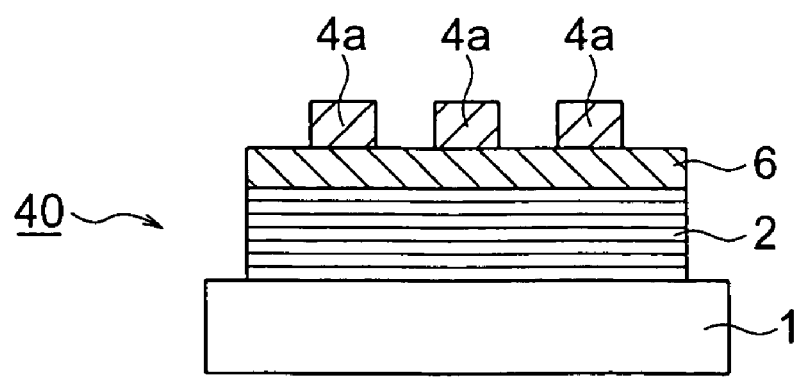

Referring to FIG. 2A, a reflective mask blank 30 for use in production of a reflective mask according to a second embodiment of this invention has a structure in which a reflective multilayer film 2, a protection layer 6, and an absorber layer 4 are successively formed on a substrate 1. FIGS. 2A through 2C show a series of steps for producing a reflective mask 40 according to this invention by patterning the absorber layer 4 of the reflective mask blank 30.

At first, the reflective mask blank 10 illustrated in FIG. 1A and the reflective mask blank 30 illustrated in FIG. 2A will be described.

As described above, the reflective mask blank 10 according to the first embodiment comprises the reflective multilayer film 2, the buffer layer 3, and the absorber layer 4 which are successively formed on the substrate 1. On the other hand, the reflective mask blank 30 according to the second embodiment comprises the reflective multilayer film 2, the protection layer 6, and the absorber layer 4 which are successively formed on the substrate 1.

In order to prevent pattern distortion due to heat during exposure, the substrate 1 preferably has a low thermal expansion coefficient within a range of $0 \pm 1.0 \times 10^{-7}/°$ C., more preferably within a range of $0 \pm 0.3 \times 10^{-7}/°$ C. As a material having such a low thermal expansion coefficient within the above-mentioned range, use may be made of an amorphous glass, a ceramic material, and a metal. As the amorphous glass, an $SiO_2$-$TiO_2$ glass and a quartz glass may be used. As a crystallized glass that is the ceramic material, a crystallized glass with β-quartz solid solution deposited therein may be used. As the metal, Invar alloy (Fe-Ni alloy) may be used.

In order to achieve high reflectivity and high transfer accuracy, the substrate preferably has high smoothness and high flatness. In particular, the substrate preferably has a surface roughness of 0.2 nm in Rms or less and a flatness of 100 nm or less (as a value in a 142 mm square area). Further, the substrate preferably has high rigidity in order to prevent deformation due to film stress of a film formed thereon. In particular, the substrate 1 preferably has a high Young's modulus not lower than 65 GPa.

The unit Rms representative of the surface roughness is a root-mean-square roughness which may be measured by an atomic force microscope. The flatness is a value indicating surface warp (deformation) given by TIR (Total Indicated Reading). Specifically, a focal plane is defined as a plane determined by a least square method with respect to the surface of the substrate. The flatness is given by an absolute value of a difference in level between a highest position and a lowest position of the surface of the substrate above and below the focal plane, respectively.

Next, the reflective multilayer film 2 will be described. The reflective multilayer film 2 is formed by periodically laminating a plurality of layers made of different materials different in refractive index. Generally, the reflective multilayer film 2 is formed by about 40 periods of alternate lamination of thin films of a heavy element or a compound thereof and thin films of a light element or a compound thereof.

For example, as a reflective multilayer film for EUV light having a wavelength of 13-14 nm, use is preferably made of an Mo/Si periodic laminated film comprising about 40 periods of alternate lamination of Mo layers and Si layers. Besides, as a reflective multilayer film used in the EUV region, use may be made of an Ru/Si periodic laminated film, an Mo-compound/Si-compound periodic laminated film, an Si/Nb periodic laminated film, an Si/Mo/Ru periodic laminated film, an Si/Mo/Ru/Mo periodic laminated film, and an Si/Ru/Mo/Ru periodic laminated film. For example, the Si/Ru/Mo/Ru periodic laminated film is formed by about several tens of periods of alternate lamination of Si layers, Ru layers, Mo layers, and Ru layers. In any event, the material of the reflective multilayer film is appropriately selected in dependence upon an exposure wavelength.

In this invention, the topmost layer of the reflective multilayer film 2 may be one of these layers forming the periodic laminated film. Alternatively, the topmost layer of the reflective multilayer film 2 may be a protection film formed on the periodic laminated film in order to protect the reflective multilayer film 2. In other words, the topmost layer is a layer which is located under and adjacent to a patterned layer defining a nonreflecting region for exposure light and which is continuously formed on a predetermined region on the substrate to define the surface of a reflecting region of the mask.

In this embodiment, the topmost layer of the reflective multilayer film 2 is a layer containing Si as a main component. The layer containing Si as a main component may be made of elemental Si, a combination of Si and impurity elements such as B and N, or an Si compound such as silicon oxide (SiOx).

The reflective multilayer film 2 may be formed by depositing the respective layers using DC magnetron sputtering, ion beam deposition (ion beam sputtering), and so on. The above-mentioned Mo/Si periodic laminated film may be formed in the following manner. At first using an Si target, an Si film having a thickness of several nanometers is deposited by DC magnetron sputtering in an Ar gas atmosphere. Then, using an Mo target, an Mo film having a thickness of several nanometers is deposited in an Ar gas atmosphere. The above-mentioned deposition of the Si film and the Mo film is defined as a single period. After deposition of 30-60 periods, another Si film is finally deposited.

The buffer layer 3 serves to protect the reflective multilayer film 2 upon patterning the absorber layer 4. Therefore, the material of the buffer layer 3 is selected from those materials resistant against the environment during patterning and repairing of the absorber layer 4. The buffer layer 3 in the first embodiment can be patterned by an oxygen-containing plasma process. Among those materials of the type, a material containing Cr as a main component is preferable because the smoothness of the film is excellent. The material containing Cr as a main component is preferable also because the etch selectivity to Si is high so that the buffer layer 3 can be patterned without no substantial decrease in thickness of the film which contains Si as a main component and which forms the topmost layer of the reflective multilayer film 2.

The material containing Cr as a main component includes a Cr elemental metal or a Cr alloy. The smoothness of the surface is further improved if the material containing Cr as a main component has a microcrystalline structure or an amorphous structure.

The material containing Cr as a main component may be chromium nitride (CrNx) or a material containing Cr and either C or O. Inclusion of nitrogen improves the smoothness. Addition of carbon improves dry-etching resistance. Addition of oxygen achieves lower stress of the film.

As the buffer layer which can be etched by the oxygen-containing plasma process, use may also be made of a material containing Ru as a main component. As the material containing Ru as a main component may be elemental Ru, an Ru alloy, ruthenium nitride (RuN).

The buffer layer 3 may be formed on the reflective multilayer film 2 by sputtering, such as DC magnetron sputtering, RF sputtering, and ion beam sputtering.

Next, the absorber layer 4 has a function of absorbing the EUV light as the exposure light. As the absorber layer 4 according to the first embodiment, use may be made of a material containing tantalum (Ta) as a main component. Herein, "containing Ta as a main component" means that, among metal elements contained in the material, Ta has a greatest composition ratio. Generally, the material containing Ta as a main component is a Ta elemental metal or a Ta alloy. Preferably, the absorber layer 4 has a microcrystalline structure or an amorphous structure in view of the smoothness.

As the material containing Ta as a main component, use may be made of elemental Ta, a material containing Ta and B, a material Ta and N, a material containing Ta, B, and at least one of O and N, a material containing Ta and Si, a material Ta, Si, and N, a material containing Ta and Ge, a material containing Ta, Ge, and N, and so on. By addition of B, Si, or Ge, an amorphous material is easily obtained and the smoothness can be improved. Addition of N or O to Ta improves oxidation resistance so as to improve the stability over time. Among others, the material containing T and B or the material containing Ta, B, and N are particularly preferable. In case of the material containing Ta and B, the ratio Ta/B falls within a range between 8.5/1.5 and 7.5/2.5. In case of the material containing Ta, B, and N, the ratio of N is 5-30 at % and, with respect to the balance assumed to be 100, the ratio of B is 10-30 at %. With the above-mentioned materials, the microcrystalline structure or the amorphous structure is readily obtained and the smoothness is excellent.

The absorber layer 4 containing Ta as a main component is preferably formed by sputtering such as magnetron sputtering. For example, in case of the TaBN film, deposition may be carried out by sputtering using a sputter target containing tantalum (Ta) and boron (B) and a sputter gas containing an argon gas with nitrogen added thereto. In case where deposition is carried out by sputtering, it is possible to readily control internal stress by changing power supplied to the sputter target or the pressure of the sputter gas. Since the deposition can be carried out at a low temperature such as room temperature, it is possible to suppress the influence of heat upon the reflective multilayer film or the like.

Instead of the material containing Ta as a main component, use may be made of, for example, WN, TiN, and Ti.

The absorber layer 4 may have a laminated structure comprising a plurality of layers.

The absorber layer 4 must have a thickness such that the EUV light as the exposure light is sufficiently absorbed. Typically, the thickness falls within a range from 30 to 100 nm.

Next, the protection layer 6 in the second embodiment serves to protect the reflective multilayer film 2 upon patterning the absorber layer 4 and to improve the reflectivity of the reflective multilayer film 2. Accordingly, the material of the protection layer 6 is selected from those materials resistant against the environment upon patterning and repairing of the absorber layer 4. The protection layer 6 is formed throughout an entire surface of the reflective multilayer film 2 in the reflective mask 40 as a final product without being removed in the reflecting region. The protection layer 6 may be made of a material containing Ru, a material containing SiO, or a material containing SiC. Among others, the material containing Ru is preferable because high reflectivity is stably obtained. For example, the material containing Ru may be an Ru elemental metal, an RuSi alloy, an RuMo alloy, an RuNb alloy, an RuZr alloy, an RuY alloy, an RuB alloy, an RuTi alloy, and an RuLa alloy. Addition of nitrogen to the metal or the alloys mentioned above is preferable because the smoothness of the film is improved and lower stress is achieved.

Figure 1B:
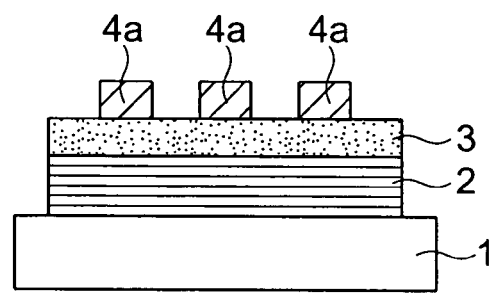

Next referring to FIG. 1B, a predetermined pattern is formed in the absorber layer 4 of the reflective mask blank 10. At first, a resist layer is formed on the absorber layer 4. By electron beam writing or optical exposure and development, a resist pattern is formed. Next, using the resist pattern as a mask, the absorber layer 4 is patterned to form an absorber pattern 4a. If the absorber layer 4 comprises a film containing Ta as a main component, patterning can be carried out by dry etching using a chlorine gas.

In patterning of the absorber layer 4, the buffer layer 3 serves as a protection film for the reflective multilayer film 2. In the first embodiment, the buffer layer 3 comprises a film containing Cr as a main component and has a resistance against chlorine-gas etching as high as 20 times or more as compared with the Ta-based absorber layer 4. Therefore, after the absorber layer 4 is patterned, the buffer layer 3 keeps a sufficient thickness. If necessary, the resist pattern is removed after patterning.

Figure 1C:
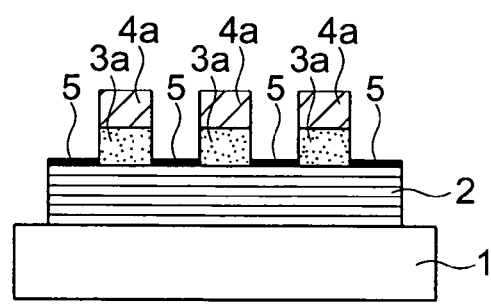

Next referring to FIG. 1C, the buffer layer 3 is patterned to form a buffer pattern 3a. Specifically, a part of the buffer layer 3 which is exposed after patterning of the absorber layer 4 is removed along the absorber pattern 4a of the absorber layer 4. In case of the buffer layer 3 comprising the film containing Cr as a main component, the buffer layer 3 is removed by dry etching using a gas containing oxygen and chlorine to expose the reflective multilayer film 2. This corresponds to the oxygen-containing plasma process. At this time, the Si layer as the topmost layer of the reflective multilayer film 2 as an underlying layer has etch selectivity for the above-mentioned gas as high as 20 times or more as compared with the buffer layer 3. Therefore, the Si layer is not substantially etched but an oxide layer 5 having a thickness of several nanometers is formed on an exposed surface of the Si layer. Presumably, the oxide layer 5 is deposited as a result of reaction between Si of the topmost layer of the reflective multilayer film 2 and oxygen plasma contained in the etching gas.

Next, treatment is carried out in order to remove the oxide layer 5 deposited on the exposed surface of the reflective multilayer film 2 which is exposed by patterning of the buffer layer 3. The treatment may be carried out in various manners.

According to a first method, the exposed surface of the reflective multilayer film 2 is brought into contact with an aqueous solution containing at least one of hydrofluoric acid (HF) and fluorosilisic acid ($H_2SiF_6$). In case where the aqueous solution of hydrofluoric acid is used, the concentration is preferably 0.1-2%. On the other hand, if the aqueous solution of fluorosilicic acid is used, the concentration is preferably 0.1-5%. If the concentration is excessively high, the etching rate is excessively high. In this event, the amount etched and removed is difficult to control and the Si layer as the topmost layer of the reflective multilayer film 2 as the underlying layer may possibly be damaged. On the other hand, if the concentration is excessively low, the oxide layer is not sufficiently removed.

More in detail, an entire surface on the side of the exposed surface of the reflective multilayer film 2 is dipped and held in the above-mentioned aqueous solution at a predetermined temperature for a predetermined time period depending upon the concentration of HF or $H_2SiF_6$ and the volume of the solution. For example, if the oxide layer having a thickness of about 2 nm is deposited on the topmost layer of the reflective multilayer film 2, the treatment is carried out by the use of 0.4% HF aqueous solution at room temperature for about 60 seconds or by the use of 0.5% $H_2SiF_6$ aqueous solution at room temperature for about 60 seconds.

According to a second method, the exposed surface of the reflective multilayer film 2 is brought into contact with an alkali aqueous solution. As the alkali aqueous solution, a sodium hydroxide (NaOH) aqueous solution or a potassium hydroxide (KOH) aqueous solution may be used. If the sodium hydroxide aqueous solution or the potassium hydroxide aqueous solution is used, the concentration is preferably 10-50%. If the concentration is excessively high, the etching rate is excessively high. In this event, the amount etched and removed is difficult to control and the Si layer as the topmost layer of the reflective multilayer film 2 as the underlying layer may possibly be damaged. On the other hand, if the concentration is excessively low, the oxide layer is not sufficiently removed.

More in detail, the entire surface on the side of the exposed surface of the reflective multilayer film 2 is dipped and held in the above-mentioned alkali aqueous solution at a predetermined temperature for a predetermined time period in the manner similar to the first method.

According to a third method, the exposed surface of the reflective multilayer film 2 is brought into contact with plasma of a fluorine-containing gas. As the fluorine-containing gas, use may be made of $SF_6$, $CF_4$, $C_2F_6$, and $NF_3$. The plasma of the fluorine-containing gas may be generated by the use of reactive ion etching (RIE). The exposed surface of the reflective multilayer film 2 is brought into contact with the above-mentioned plasma and held at a predetermined temperature for a predetermined time period depending upon the type of the plasma. For example, if the oxide layer having a thickness of about 2 nm is deposited on the topmost layer of the reflective multilayer film 2, treatment is carried out by RIE using $SF_6$ for about 30 seconds under the conditions of the substrate temperature of 20° C., the gas pressure of 0.5 Pa, and the RF bias of 100 W. Contact with the plasma may be carried out by generating the plasma in a reaction chamber where the substrate is placed.

In each method, the treatment condition is adjusted so that deposition of the oxide layer can be removed without eroding the topmost layer of the reflective multilayer film 2 as the underlying layer. In order to suppress the damage upon the absorber layer 4, the second method is preferable.

Figure 1D:
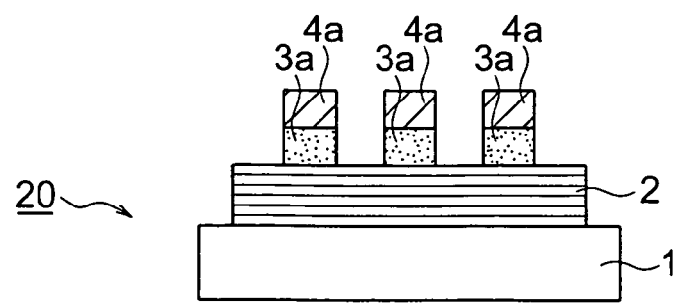

In the above-mentioned manner, the reflective mask 20 according to the first embodiment is obtained after the oxide layer 5 deposited on the reflective multilayer film 2 is removed, as illustrated in FIG. 1D.

As described above, in the method of producing a reflective mask according to this invention, it is possible to suppress the decrease in reflectivity resulting from deposition of the reaction product such as oxide on the surface of the reflective multilayer film during the mask production process.

In the first embodiment, the reflective mask 20 has a structure comprising the buffer layer 3 formed on the reflective multilayer film 2.

On the other hand, in the second embodiment, the reflective mask 40 illustrated in FIG. 2C comprises a protection layer or a film having another function formed on the reflective multilayer film 2, instead of the buffer layer. The method of this invention is also applicable to the reflective mask according to the second embodiment.

Referring to FIG. 2B, a predetermined pattern is formed in the absorber layer 4 of the reflective mask blank 30 in the following manner. At first, a resist layer is formed on the absorber layer 4. Then, by electron beam writing or optical exposure and development, a resist pattern is formed. Next, using the resist pattern as a mask, the absorber layer 4 is patterned to form an absorber pattern 4a. If the absorber layer 4 comprises a film containing Ta as a main component, patterning can be carried out by dry etching using a chlorine gas.

In patterning of the absorber layer 4, the protection layer 6 serves as a protection film for the reflective multilayer film 2. In the second embodiment, the protection layer 6 comprises a film containing Ru as a main component and has a resistance against chlorine-gas etching as high as 50 times or more as compared with the Ta-based absorber layer 4. Therefore, after the absorber layer 4 is patterned, the protection layer 6 maintains a sufficient thickness. If necessary, the resist pattern is removed after patterning. At this time, the protection layer 6 is not substantially etched but a silicide layer or a silicon oxide layer 7 having a thickness of several nanometers is formed on an exposed surface of the protection layer 6 as a result of deposition of a reaction product. Presumably, the silicide layer or the silicon oxide layer 7 is deposited as a result of reaction between an Si-based material in a processing chamber and oxygen ($O_2$) remaining in the processing chamber.

Next, the silicide layer or the silicon oxide layer 7 is removed from the surface of the protection layer 6 by the use of any one of the first through the third methods mentioned above.

In the above-mentioned manner, the reflective mask 40 is obtained after the silicide layer or the silicon oxide layer 7 as the reaction product deposited on the reflective multilayer film 2 is removed, as illustrated in FIG. 2C.

As described above, in the method of producing a reflective mask according to this invention, it is possible to suppress the decrease in reflectivity resulting from deposition of the reaction product on the surface of the protection film formed on the reflective multilayer film during the mask production process.

This invention is also applicable to the case where the reflective mask is produced by directly forming the absorber layer on the reflective multilayer film without forming the buffer layer or the protection layer and by patterning the absorber layer. In this case, as the absorber layer, use may be made of a material containing Cr as a main component (for example, CrN, CrON, CrCON, and so on).

The material of each layer of the reflective mask is not restricted to the above-mentioned material. At any rate, this invention is applicable to the case where a deposit of oxide, silicide, silicon oxide, or the like as a reaction product is produced on the exposed surface of the reflective multilayer film (or the protection film) which is exposed following patterning of the layer on the reflective multilayer film (or the protection film).

In the first embodiment, description has been made about the case where the reaction product deposited on the reflective multilayer film 2 following patterning of the buffer layer 3 is removed. Not being limited to patterning of the buffer layer, this invention is also applicable to any deposited substance left on the reflective multilayer film during production or use of the reflective mask. For example, in case where a deposit such as oxide is left on the reflective multilayer film during a cleaning process, during holding in air, or due to exposure to the EUV light, the deposited substance can be removed in the similar manner.

The above-mentioned reflective mask according to this invention is especially advantageous if the EUV light (having a wavelength of 0.2-100 nm) is used as the exposure light but may appropriately be used for the exposure light having a different wavelength.

Now, this invention will be described more in detail in conjunction with several specific examples. For convenience of description, the reference numerals in FIGS. 1A through 1D and 2A through 2C will be used as appropriate.

EXAMPLE 1

As the substrate 1, preparation was made of a low-expansion $SiO_2$-$TiO_2$ glass substrate having an outer dimension of 6-inch square and a thickness of 6.3 mm. The glass substrate was subjected to mechanical polishing to have a surface roughness of 0.12 nm in Rms and a flatness of 100 nm or less.

Next, on the substrate 1, the reflective multilayer film 2 was formed. Assuming exposure light having a wavelength of 13-14 nm, the reflective multilayer film 2 was formed as a laminated film comprising Mo layers and Si layers. The laminated film was formed in the following manner. By DC magnetron sputtering, an Si film was deposited to the thickness of 4.2 nm by the use of an Si target under an Ar gas pressure of 0.1 Pa. Then, an Mo film was deposited to the thickness of 2.8 nm by the use of an Mo target under an Ar gas pressure of 0.1 Pa. The above-mentioned deposition of the Si film and the Mo film was defined as a single period. After deposition of 40 periods, another Si film was finally deposited to the thickness of 11 nm.

Herein, the surface roughness of the reflective multilayer film 2 was 0.12 nm in Rms. For the substrate 1 with the reflective multilayer film 2, the reflectivity was measured by the use of EUV light having a wavelength of 13.4 nm and an incident angle of 5°. As a result, the reflectivity was equal to 65%. Thus, the reflection characteristic was excellent.

Next, the buffer layer 3 was formed on the reflective multilayer film 2. As the buffer layer 3, a chromium nitride film was formed to the thickness of 20 nm. The buffer layer 3 was deposited by DC magnetron sputtering using a Cr target and a sputter gas comprising a mixture of Ar and $N_2$. In the CrNx film thus deposited, the concentration of $N_2$ was 10% (x=0.1).

Next, on the buffer layer 3 comprising the CrNx film, the absorber layer 4 was deposited to the thickness of 70 nm. The absorber layer 4 was made of a material containing Ta, B, N, and O. Specifically, the absorber layer 4 was deposited by DC magnetron sputtering using a target containing Ta and B and a sputter gas containing Ar with 10% nitrogen and 40% oxygen added thereto. In the TaBNO film thus deposited, B, N, and 0 were 0.1, 0.1, and 0.4, respectively. Thus, an EUV reflective mask blank was obtained.

Next, by the use of the EUV reflective mask blank, a reflective mask having a pattern for 16 Gbit-DRAM having a design rule of 0.07 µm was prepared in the following manner.

At first, the reflective mask blank was coated with an EB resist. By EB writing and development, a resist pattern was formed.

Using the resist pattern as a mask, the absorber layer 4 was dry-etched using chlorine to form an absorber pattern in the absorber layer 4.

The buffer layer 3 of chromium nitride was dry-etched by the use of a mixed gas of chlorine and oxygen and removed following the absorber pattern of the absorber layer 4 to expose the reflective multilayer film 2.

After patterning the buffer layer 3 of chromium nitride, the exposed surface of the reflective multilayer film 2 was observed by low-angle X-ray diffraction. As a result, it was found out that a silicon oxide (SiOx) layer was deposited to the thickness of 2 nm. Further, the reflectivity was measured by EUV light having a wavelength of 13.4 nm and an incident angle of 5°. As a result, the reflectivity in the reflecting region was decreased to 62%.

Then, the exposed surface of the reflective multilayer film 2 was dipped in a 0.2% hydrofluoric acid (HF) solution at room temperature for 2 minutes to remove the silicon oxide (SiOx) layer deposited thereon. By this treatment, the silicon oxide (SiOx) layer was completely removed and the reflective mask in Example 1 was obtained.

For the reflective mask thus obtained, the reflectivity was measured by the use of EUV light having a wavelength of 13.4 nm and an incident angle of 5°. As a result, the initial reflectivity of 65% was maintained.

In the reflective mask thus obtained, the absorber pattern 4a of the absorber layer 4 has a sufficiently small edge roughness. By the use of a pattern transfer apparatus 50 illustrated in FIG. 3, exposure transfer to a semiconductor substrate by EUV light was carried out. As a result, it was confirmed that the reflective mask had a sufficient exposure characteristic.

Now, description will be made of a method of transferring a pattern by EUV light to a semiconductor substrate (silicon wafer) 33 with a resist by the use of the pattern transfer apparatus 50 illustrated in FIG. 3 and the reflective mask 20.

The pattern transfer apparatus 50 comprises a laser plasma X-ray source 31, the reflective mask 20, and a reducing optical system 32. The reducing optical system 32 comprises a plurality of X-ray reflection mirrors. One of the X-ray reflection mirrors is depicted by 32-1 in the figure. A pattern reflected by the reflective mask 20 is typically reduced by the reducing optical system 32 to about ¼. Since the wavelength band of 13-14 nm was used as the exposure wavelength, an optical path was preliminarily positioned in vacuum.

In the above-mentioned state, EUV light emitted from the laser plasma X-ray source 31 was incident to the reflective mask 20. The light reflected by the reflective mask 20 was directed to the silicon wafer 33 through the reducing optical system 32.

The light incident to the reflective mask 20 was not reflected but was absorbed to the absorber layer 4 in a part where the absorber pattern 4a is present. On the other hand, the light incident to another part without the absorber pattern 4a was reflected by the reflective multilayer film 2. In the above-mentioned manner, an image formed by the light reflected by the reflective mask 20 was incident to the reducing optical system 32. The exposure light passing through the reducing optical system 32 exposed a transfer pattern on a resist layer on the silicon wafer 33. Subsequently, the resist layer after exposure was developed. Thus, a resist pattern was formed on the silicon wafer 33.

As a result of pattern transfer onto the silicon wafer 33 in the above-mentioned manner, it was confirmed that the EUV reflective mask in Example 1 had an accuracy of 16 nm or less, as required in the 70 nm design rule.

EXAMPLE 2

In the manner similar to Example 1, a reflective mask blank was produced and each of the absorber layer 4 and the buffer layer 3 of the reflective mask blank was patterned.

Like in Example 1, deposition of a silicon oxide (SiOx) layer was observed on the exposed surface of the reflective multilayer film 2 after the buffer layer 3 of chromium nitride was patterned.

In Example 2, the exposed surface of the reflective multilayer film 2 was subjected to plasma treatment for one minute by reactive ion etching using an $SF_6$ gas.

After plasma treatment, the silicon oxide (SiOx) layer was removed from the surface of the reflective multilayer film 2 and a reflective mask in Example 2 was obtained.

For the reflective mask thus obtained, the reflectivity was measured by the use of EUV light having a wavelength of 13.4 nm and an incident angle of 5°. As a result, the reflectivity was equal to 65%. Thus, the reflection characteristic was excellent.

Further, the edge roughness of the absorber pattern of the absorber layer 4 of the reflective mask was sufficiently small. In the manner similar to Example 1, exposure transfer to the semiconductor substrate by EUV light was carried out by the use of the pattern transfer apparatus 50 illustrated in FIG. 3. As a result, it was confirmed that the reflective mask had a sufficient exposure characteristic. It was also con-

EXAMPLE 3

In the manner similar to Example 1, a reflective mask blank was produced and each of the absorber layer 4 and the buffer layer 3 of the reflective mask blank was patterned.

Like in Example 1, it was observed that a silicon oxide (SiOx) layer was deposited on the exposed surface of the reflective multilayer film 2 after patterning of the buffer layer 3 of chromium nitride.

In Example 3, the exposed surface of the reflective multilayer film 2 was dipped in a 0.5% fluorosilicic acid solution at room temperature for 1 minute to remove the silicon oxide (SiOx) layer deposited thereon. By this treatment, the silicon oxide (SiOx) layer was removed and a reflective mask in Example 3 was obtained.

For the reflective mask thus obtained, the reflectivity was measured by the use of EUV light having a wavelength of 13.4 nm and an incident angle of 5°. As a result, the reflectivity was equal to 65%. Thus, the reflection characteristic was excellent.

Further, the edge roughness of the absorber pattern of the absorber layer 4 of the reflective mask was sufficiently small. In the manner similar to Example 1, exposure transfer to the semiconductor substrate by EUV light was carried out by the use of the pattern transfer apparatus 50 illustrated in FIG. 3. As a result, it was confirmed that the reflective mask had a sufficient exposure characteristic. It was also confirmed that the EUV reflective mask in Example 3 had an accuracy of 16 nm or less, as required in the 70 nm design rule.

EXAMPLE 4

In the manner similar to Example 1, a reflective mask blank was produced and each of the absorber layer 4 and the buffer layer 3 of the reflective mask blank was patterned.

Like in Example 1, it was observed that a silicon oxide (SiOx) layer was deposited on the exposed surface of the reflective multilayer film 2 after patterning of the buffer layer 3 of chromium nitride.

In Example 4, the exposed surface of the reflective multilayer film 2 was dipped in a 10% sodium hydroxide solution at room temperature for 0.5 minute to remove the silicon oxide (SiOx) layer deposited thereon. By this treatment, the silicon oxide (SiOx) layer was removed and a reflective mask in Example 4 was obtained.

For the reflective mask thus obtained, the reflectivity was measured by the use of EUV light having a wavelength of 13.4 nm and an incident angle of 5°. As a result, the reflectivity was equal to 65%. Thus; the reflection characteristic was excellent.

Further, the edge roughness of the absorber pattern of the absorber layer 4 of the reflective mask was sufficiently small. In the manner similar to Example 1, exposure transfer to the semiconductor substrate by EUV light was carried out by the use of the pattern transfer apparatus 50 illustrated in FIG. 3. As a result, it was confirmed that the reflective mask had a sufficient exposure characteristic. It was also confirmed that the EUV reflective mask in Example 4 had an accuracy of 16 nm or less, as required in the 70 nm design rule.

firmed that the EUV reflective mask in Example 2 had an accuracy of 16 nm or less, as required in the 70 nm design rule.

EXAMPLE 5

In Example 5, a reflective mask was produced in the manner similar to Example 1 except that the buffer layer 3 containing Ru as a main component was deposited to the thickness of 30 nm.

The buffer layer 3 of Ru was formed by DC magnetron sputtering using an Ru target and a sputter gas comprising an Ar gas. The buffer layer 3 was patterned by dry etching via a plasma process using a gas containing chlorine and oxygen.

After pattering of the buffer layer 3, a silicon oxide (SiOx) layer was deposited on the exposed surface of the reflective mutilayer film 2 to the thickness of 2.5 nm.

Under the conditions similar to Example 1, treatment by HF aqueous solution was carried out to remove the oxide layer deposited as mentioned above. Thus, the reflective mask was obtained.

On the other hand, under the conditions similar to that in Example 2, plasma treatment was carried out after patterning of the buffer layer 3. In this case also, the silicon oxide (SiOx) layer was similarly removed.

For the reflective mask in Example 5 subjected to HF aqueous solution treatment or fluorine-containing plasma treatment, the reflectivity was measured by the use of EUV light having a wavelength of 13.4 nm and an incident angle of 5°. As a result, the reflectivity was equal to 65% in each case. Thus, the reflection characteristic was excellent.

Further, the edge roughness of the absorber pattern of the absorber layer 4 of the reflective mask was sufficiently small. Exposure transfer to the semiconductor substrate by EUV light was carried out by the use of the pattern transfer apparatus 50 illustrated in FIG. 3. As a result, it was confirmed that the reflective mask had a sufficient exposure characteristic. It was also confirmed that the EUV reflective mask in Example 5 had an accuracy of 16 nm or less, as required in the 70 nm design rule.

EXAMPLE 6

In Example 6, a reflective mask having a structure in which the absorber layer 4 comprising the absorber pattern 4a was formed on the reflective multilayer film 2 without a buffer layer was produced.

At first, in the manner similar to Example 1, the reflective multilayer film 2 was formed on the glass substrate 1.

Next, on the reflective multilayer film 2, a CrNO (chromium oxynitride) film as the absorber layer 4 was deposited to the thickness of 100 nm. Deposition was carried out by DC magnetron sputtering using a Cr target and a sputter gas containing Ar with 20% nitrogen and 20% oxygen added thereto. In the CrNO film thus deposited, N and O were 0.2 and 0.2, respectively. Thus, a reflective mask blank was obtained.

Next, by the use of the reflective mask blank thus obtained, the reflective mask having a pattern for 16 Gbit-DRAM having a design rule of 0.07 μm was prepared in the manner similar to Example 1. At first, a resist pattern was formed on the reflective mask blank. Thereafter, using the resist pattern as a mask, the absorber layer 4 of CrNO was dry-etched using a mixed gas of chlorine and oxygen to form the absorber pattern 4a of the absorber layer 4. Thereafter, the resist pattern was removed.

After forming the absorber pattern 4a of the absorber layer 4, the exposed surface of the reflective multilayer film 2 was observed by low-angle X-ray diffraction. As a result, it was found out that a silicon oxide (SiOx) layer was deposited to the thickness of 3 nm. Further, the reflectivity was measured by EUV light having a wavelength of 13.4 nm and an incident angle of 5°. As a result, the reflectivity in the reflecting region was decreased to 61% as compared with the initial value of 65%.

Then, the exposed surface of the reflective multilayer film 2 was dipped in a 0.2% hydrofluoric acid (HF) solution at room temperature for 1 minute to remove the silicon oxide (SiOx) layer deposited thereon.

On the other hand, plasma treatment using an $SF_6$ gas was carried out for 0.5 minute after forming the absorber pattern 4a of the absorber layer 4. In this case also, the silicon oxide (SiOx) layer was similarly removed.

For the reflective mask in Example 6 subjected to HF aqueous solution treatment or fluorine-containing plasma treatment, the reflectivity was measured by the use of EUV light having a wavelength of 13.4 nm and an incident angle of 5°. As a result, the reflectivity was equal to 65% in each case. Thus, the reflection characteristic was excellent.

Further, the edge roughness of the absorber pattern of the absorber layer 4 of the reflective mask was sufficiently small. Exposure transfer to the semiconductor substrate by EUV light was carried out by the use of the pattern transfer apparatus 50 illustrated in FIG. 3. As a result, it was confirmed that the reflective mask had a sufficient exposure characteristic. It was also confirmed that the EUV reflective mask in Example 6 had an accuracy of 16 nm or less, as required in the 70 nm design rule.

EXAMPLE 7

In Example 7, a reflective mask having a structure in which the protection layer 6 for improving the reflectivity and the absorber layer 4 comprising the absorber pattern 4a were formed on the reflective multilayer film 2 without a buffer layer was produced.

On the reflective multilayer film 2, the protection layer 6 containing Ru as a main component was deposited to the thickness of 2 nm. The protection layer 6 was deposited by DC magnetron sputtering using an Ru target in an Ar gas atmosphere.

Next, on the protection layer 6, a material containing Ta, B, and N was deposited to the thickness of 70 nm to form the absorber layer 4. The absorber layer 4 was deposited by DC magnetron sputtering using a target containing Ta and B and a sputter gas containing Ar with 10% nitrogen and 40% oxygen added thereto. In the TaBNO film thus deposited, B, N, and O were 0.1, 0.1, and 0.4, respectively. Thus, an EUV reflective mask blank was obtained.

Next, by the use of the EUV reflective mask blank, an EUV reflective mask having a pattern for 16 Gbit-DRAM having a design rule of 0.07 μm was prepared in the following manner.

At first, the reflective mask blank was coated with an EB resist. By EB writing and development, a resist pattern was formed.

Using the resist pattern as a mask, the absorber layer 4 was dry-etched using chlorine to form the absorber pattern 4a.

After forming the absorber pattern 4a of TaBN, the exposed surface of the protection layer 6 was observed by low-angle X-ray diffraction. As a result, it was found out that an SiOx layer was deposited to the thickness of 2 nm. Further, the reflectivity was measured by EUV light having a wavelength of 13.4 nm and an incident angle of 5°. As a result, the reflectivity in the reflecting region was reduced to 63%.

Then, the exposed surface of the protection layer 6 was dipped in a 0.4% hydrofluoric acid solution at room temperature for 1 minute to remove the SiOx layer deposited thereon. By this treatment, the SiOx layer was completely removed and the reflective mask in Example 7 was obtained.

For the reflective mask thus obtained, the reflectivity was measured by the use of EUV light having a wavelength of 13.4 nm and an incident angle of 5°. As a result, the reflectivity was equal to 65%. Thus, the reflection characteristic was excellent.

Further, the edge roughness of the absorber pattern of the absorber layer of the reflective mask was sufficiently small. In the manner similar to Example 1, exposure transfer to the semiconductor substrate by EUV light was carried out by the use of the pattern transfer apparatus 50 illustrated in FIG. 3. As a result, it was confirmed that the reflective mask had a sufficient exposure characteristic. It was also confirmed that the EUV reflective mask in Example 7 had an accuracy of 16 nm or less, as required in the 70 nm design rule.

COMPARATIVE EXAMPLE

In Comparative Example, a reflective mask was produced in the manner similar to Example 1 except that a silicon oxide (SiOx) layer deposited on the reflective multilayer film 2 following patterning of the buffer layer 3 of chromium nitride is not removed.

For the reflective mask thus obtained, the reflectivity was measured by the use of EUV light having a wavelength of 13.4 nm and an incident angle of 5°. As a result, the reflectivity was as low as 62%. Thus, the reflection characteristic was degraded due to deposition of oxide on the exposed surface of the reflective multilayer film 2.

Figure 3:
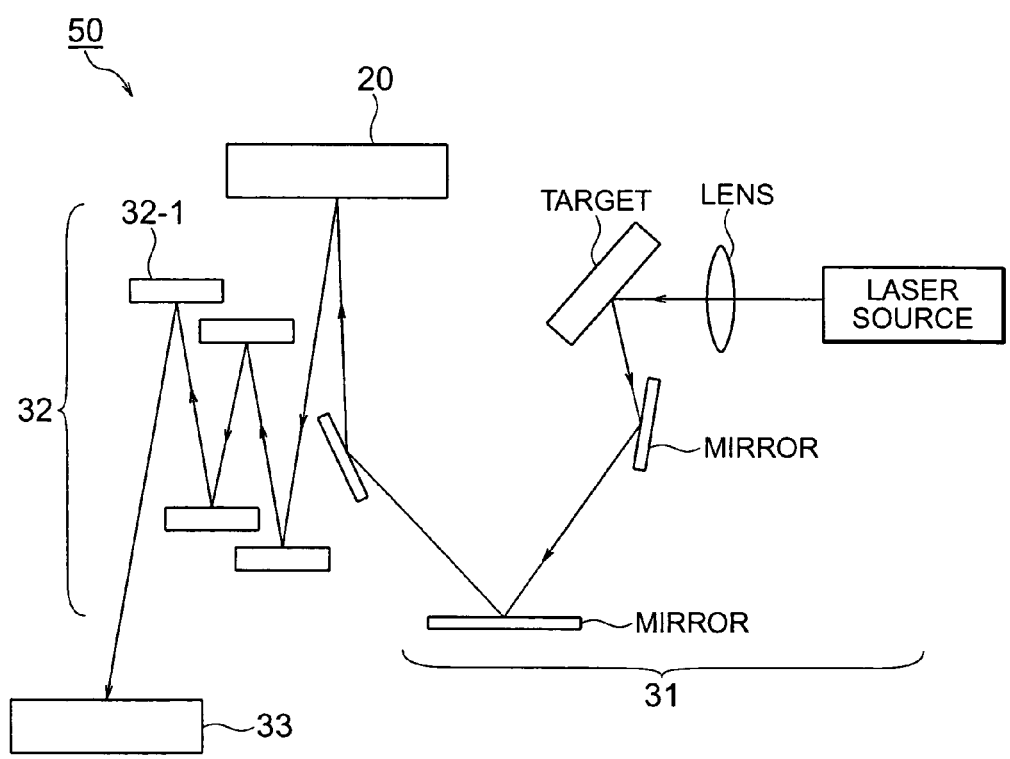
FIG. 3 is a schematic view of a pattern transfer apparatus used in the embodiments of this invention.

Exposure transfer to the semiconductor substrate by EUV light was carried out by the use of the pattern transfer apparatus 50 illustrated in FIG. 3. As a result, it was found out that the reflective mask produced in Comparative Example could not achieve sufficient throughput.

As described above, according to this invention, it is possible to suppress the decrease in reflectivity resulting from deposition of oxide or the like on the surface of the reflective multilayer film (or the protection layer) during the mask production process. Further, it is possible to obtain the reflective mask capable of carrying out exposure transfer of a pattern with high accuracy as required for an EUV mask or the like.

Although the present invention has been shown and described in conjunction with a few preferred embodiments thereof, it will readily be understood by those skilled in the art that the present invention is not limited to the foregoing description but may be changed and modified in various other manners without departing from the spirit and scope of the present invention as set forth in the appended claims.

What is claimed is:

1. A method of producing a reflective mask comprising a substrate, a reflective multilayer film formed on the substrate to reflect exposure light, and at least one layer formed as a patterned layer on the reflective multilayer film to define a nonreflecting region for the exposure light, the method comprising the steps of:
   (a) patterning a layer formed on and adjacent to a topmost layer of the reflective multilayer film; and
   (b) removing a reaction product produced following patterning in the step (a) and deposited on an exposed surface of the reflective multilayer film which is exposed as a result of patterning in the step (a) wherein:

the patterned layer defining the nonreflecting region for the exposure light comprises a laminated film including an absorber layer for absorbing the exposure light and a buffer layer made of a material resistant against an environment upon patterning of the absorber layer;

the laminated film being formed on and adjacent to the topmost layer of the reflective multilayer film, the layer patterned in the step (a) being the buffer layer.

2. A method of producing a reflective mask according to claim 1, wherein the step (b) is carried out by bringing the exposed surface of the reflective multilayer film with the reaction product formed thereon following patterning in the step (a) into contact with a solution containing hydrofluoric acid and/or fluorosilicic acid.

3. A method of producing a reflective mask according to claim 1, wherein:

the step (b) is carried out by bringing the exposed surface of the reflective multilayer film with the reaction product formed thereon following patterning in the step (a) into contact with an alkali aqueous solution.

4. A method of producing a reflective mask according to claim 1, wherein the step (b) is carried out by bringing the exposed surface of the reflective multilayer film with the reaction product formed thereon following patterning in the step (a) into contact with fluorine-containing plasma.

5. A method of producing a reflective mask according to claim 1, wherein the layer formed on and adjacent to the topmost layer of the reflective multilayer film is made of a material containing Cr or Ru as a main component.

6. A method of producing a reflective mask according to claim 1, wherein the reflective multilayer film comprises Mo layers and Si layers alternately laminated, the topmost layer of the reflective multilayer film being a layer made of elemental Si or a material containing Si as a main component.

7. A method of producing a reflective mask according to claim 1, wherein the patterned layer defining the nonreflecting region has a layer made of a material containing Ta as a main component.

8. A method of producing a semiconductor device, comprising the step of forming a fine pattern on a semiconductor substrate by lithography using the reflective mask produced by the method according to claim 1.

9. A method of producing a reflective mask according to claim 1, wherein the buffer layer is made of a material containing Cr as a main component or a material containing Ru as a main component.

10. A method of producing a reflective mask comprising a substrate, a reflective multilayer film formed on the substrate to reflect exposure light, and at least one layer formed as a patterned layer on the reflective multilayer film to define a nonreflecting region for the exposure light, the method comprising the steps of:

(a) patterning a layer formed on and adjacent to a topmost layer of the reflective multilayer film by the use of an oxygen-containing plasma process; and (b) removing oxide produced following patterning in the step (a), containing a component of the topmost layer of the reflective multilayer film, and deposited on an exposed surface of the reflective multilayer film which is exposed as a result of patterning in the step (a) wherein:

the patterned layer defining the nonreflecting region for the exposure light comprises a laminated film including an absorber layer for absorbing the exposure light and a buffer layer made of a material resistant against an environment upon patterning of the absorber layer;

the laminated film being formed on and adjacent to the topmost layer of the reflective multilayer film, the layer patterned in the step (a) being the buffer layer.

11. A method of producing a reflective mask according to claim 10, wherein the step (b) is carried out by bringing the exposed surface of the reflective multilayer film with the reaction product formed thereon following patterning in the step (a) into contact with a solution containing hydrofluoric acid and/or fluorosilicic acid.

12. A method of producing a reflective mask according to claim 10, wherein:

the step (b) is carried out by bringing the exposed surface of the reflective multilayer film with the reaction product formed thereon following patterning in the step (a) into contact with an alkali aqueous solution.

13. A method of producing a reflective mask according to claim 10, wherein the step (b) is carried out by bringing the exposed surface of the reflective multilayer film with the reaction product formed thereon following patterning in the step (a) into contact with fluorine-containing plasma.

14. A method of producing a reflective mask comprising a substrate, a reflective multilayer film formed on the substrate to reflect exposure light, a protection film formed on the reflective multilayer film to protect the reflective multilayer film, and at least one layer formed as a patterned layer on the protection film to define a nonreflecting region for the exposure light, the method comprising the steps of:

(a) patterning a layer formed on and adjacent to the protection film; and (b) removing a reaction product produced following patterning in the step (a) and deposited on an exposed surface of the protection film.

15. A method of producing a reflective mask according to claim 14, wherein the step (b) is carried out by bringing the exposed surface of the protection film with the oxide formed thereon following patterning in the step (a) into contact with a solution containing hydrofluoric acid and/or fluorosilicic acid.

16. A method of producing a reflective mask according to claim 14, wherein:

the step (b) is carried out by bringing the exposed surface of the protection film with the oxide formed thereon following patterning in the step (a) into contact with an alkali aqueous solution.

17. A method of producing a reflective mask according to claim 14, wherein the step (b) is carried out by bringing the exposed surface of the protection film with the oxide formed thereon following patterning in the step (a) into contact with fluorine-containing plasma.

18. A method of producing a reflective mask according to claim 14, wherein the protection film is made of a material containing Ru as a main component.

19. A method of producing a reflective mask comprising a substrate, a reflective multilayer film formed on the substrate to reflect exposure light, and at least one layer formed as a patterned layer on the reflective multilayer film to define a nonreflecting region for the exposure light, the method comprising the steps of:

(a) causing deposition of oxide on the reflective multilayer film, the oxide containing a component of the topmost layer of the reflective multilayer film; and (b) removing the oxide from the reflective multilayer film.

20. A method of producing a reflective mask according to claim 10, wherein the buffer layer is made of a material containing Cr as a main component or a material containing Ru as a main component.

* * * * *